United States Patent [19]

Webster

[11] Patent Number: 4,914,812
[45] Date of Patent: Apr. 10, 1990

[54] METHOD OF SELF-PACKAGING AN IC CHIP

[75] Inventor: Harold F. Webster, Scotia, N.Y.

[73] Assignee: General Electric Company, Schenectady, N.Y.

[21] Appl. No.: 312,849

[22] Filed: Feb. 17, 1989

Related U.S. Application Data

[62] Division of Ser. No. 235,087, Aug. 23, 1988, which is a division of Ser. No. 128,847, Dec. 4, 1987, Pat. No. 4,796,156.

[51] Int. Cl.⁴ ............................................... H05K 3/20
[52] U.S. Cl. ......................................... 29/831; 29/832; 29/841; 361/386; 361/389
[58] Field of Search ................. 29/840, 841, 831, 832, 29/834; 361/386, 389

[56] References Cited

U.S. PATENT DOCUMENTS

| | | | |
|---|---|---|---|
| 3,597,839 | 8/1971 | Jaccodine | 29/831 |
| 3,610,870 | 10/1971 | Sakamoto | 29/832 |
| 4,404,745 | 9/1983 | Resneau | 29/832 |
| 4,437,235 | 3/1984 | McIver | 29/832 |
| 4,658,331 | 4/1987 | Berg | 361/386 |
| 4,679,118 | 7/1987 | Johnson | 361/386 |
| 4,731,693 | 3/1988 | Berg | 361/386 |
| 4,745,456 | 5/1988 | Clemens | 361/386 |
| 4,758,927 | 7/1988 | Berg | 29/834 |
| 4,775,916 | 10/1988 | Kouzuchi | 361/389 |
| 4,812,949 | 3/1989 | Fontan | 361/386 |

Primary Examiner—P. W. Echols
Assistant Examiner—K. Jordan
Attorney, Agent, or Firm—Marvin Snyder; James C. Davis, Jr.

[57] ABSTRACT

A method of self packaging an integrated circuit chip on a printed circuit board where conductive leads form an electrical connection with interconnect leads on the printed circuit board. A centering frame placed on the printed circuit board serves to align the leads. A cooling cap which dissipates heat from the integrated circuit chip is placed over the centering frame and integrated circuit chip. In one embodiment, the leads form a pressure fit and the cooling cap forces the pressure-fit electrical connections. In another embodiment, the leads make rubbing contact with each other.

4 Claims, 4 Drawing Sheets

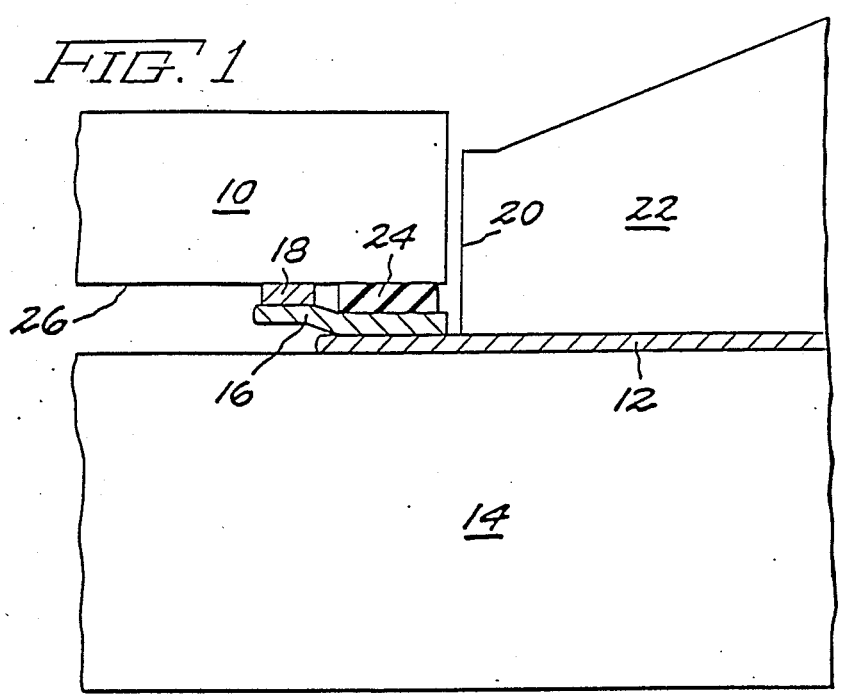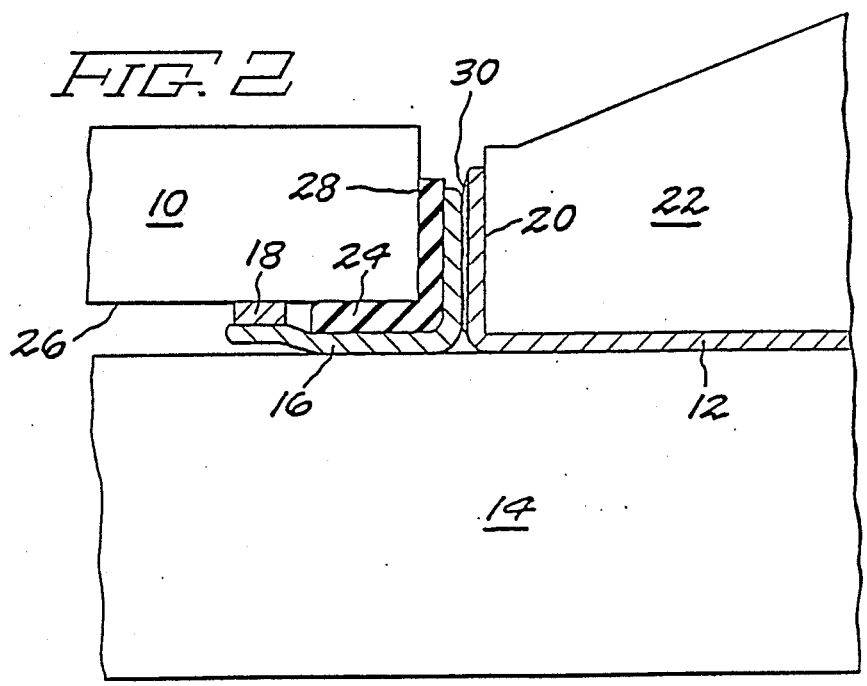

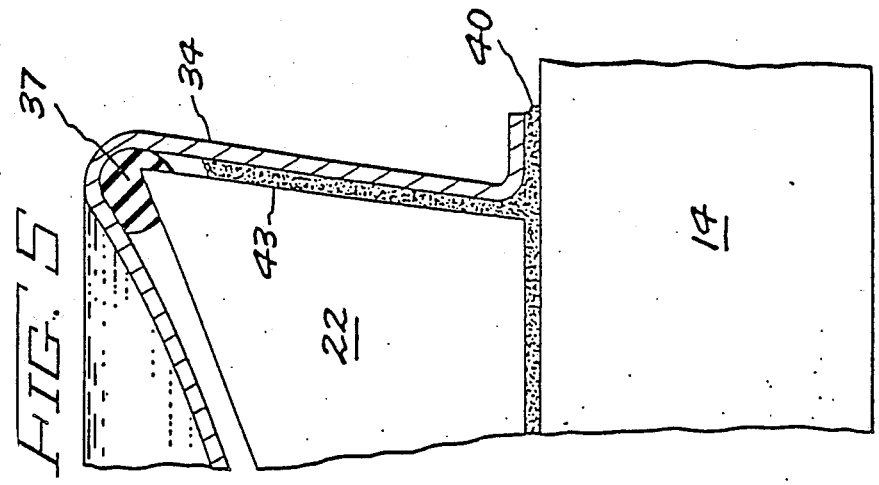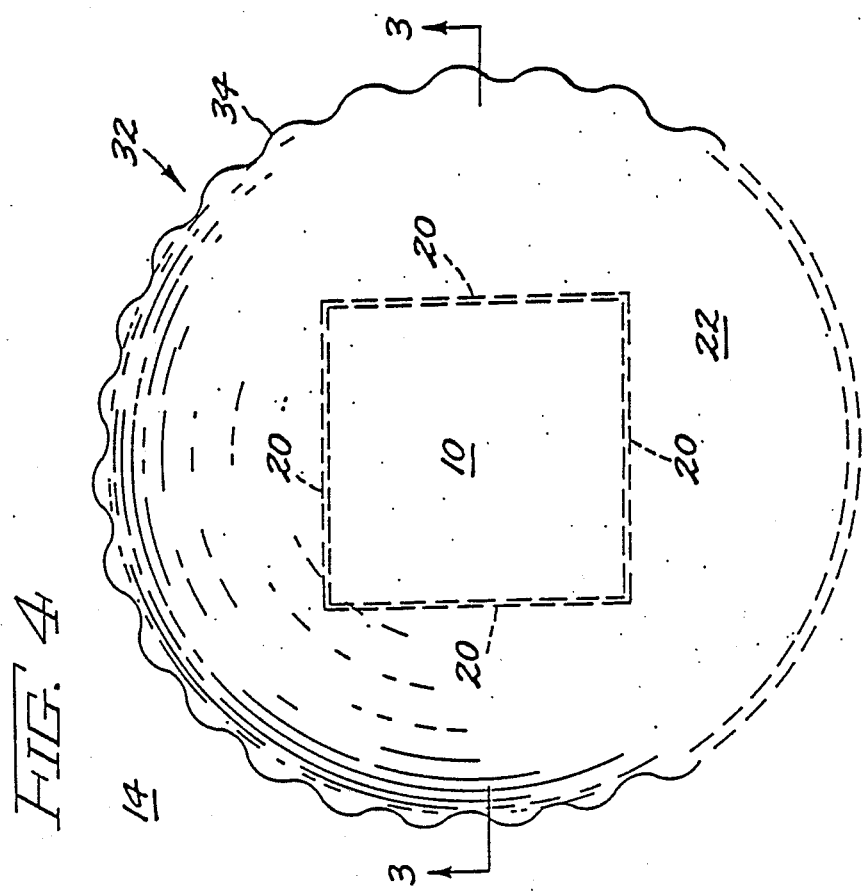

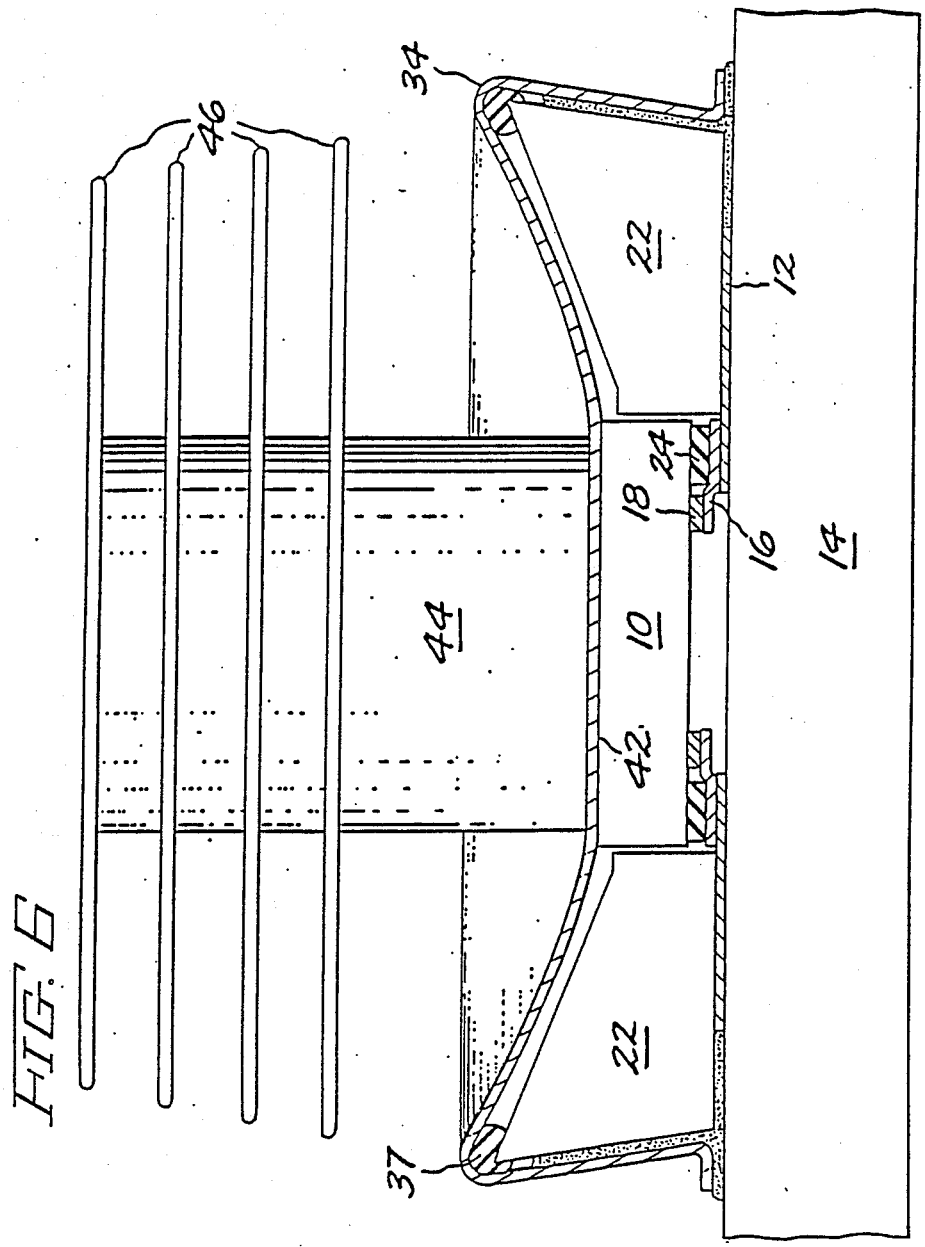

METHOD OF SELF-PACKAGING AN IC CHIP

This application is a division of application Ser. No. 235,087, filed 8/23/88 which in turn is a division of application Ser. No. 128,847 filed Dec. 4, 1987, (now U.S. Pat. No. 4,796,156, issued Jan. 3, 1989.

BACKGROUND OF THE INVENTION

1. Field of the Invention

This invention generally relates to a method and apparatus for mounting semiconductor chips on a printed circuit board and, more particularly, to a method and apparatus for directly attaching a semiconductor chip to a circuit pattern on a printed circuit board.

2. Description of the Prior Art

Semiconductor chips comprise solid state circuitry formed in a semiconductive material such as germanium or silicon. These chips are often referred to as integrated circuit (IC) chips. Integrated circuit chips are widely used in a variety of electronic equipment, from computers and communication equipment to consumer electronics and power electronics. Integrated circuit chips typically have a multiplicity of contact terminations on a side that must be electrically interconnected to external circuitry on a printed circuit board.

The conventional method of mounting integrated circuit chips to printed circuit boards makes use of packages such as the dual in-line package (DIP), the single in-line package (SIP), or the leadless chip carrier package. In the typicl DIP or SIP, the contact terminations on the integrated circuit chip are connected to a lead frame comprised of small conductive leads. Some lead frames are defined by lead patterns etched onto a plastic tape. The conductive leads are connected to larger terminal leads which are integral with the package. The terminal leads are then plugged into circuit terminals on the circuit board and soldered. In a leadless chip carrier package, the leads connected to terminals on the integrated circuit chip are conected to terminals on the package which are connected directly with the circuit pattern on the printed circuit board by soldering.

Tape automated bonding (TAB) is a packaging process in which conductive leads etched on a polymer film are automatically bonded to the contact terminals on the integrated circuit chip. A TAB machine is supplied with integrated circuit chips, a long lead frame tape which sometimes comprises a 35 mm film strip with conductive leads extending over rectangular openings in each frame of the film, and package casings with integral terminals. The TAB machine will automatically produce DIPs or SIPs ready for mounting to a circuit board.

The size of the DIP, SIP, or leadless chip carrier package is many times the size of an integrated circuit chip. The sizes of these packages were dictated in part by the technology for assembly which existed at the time the packages were developed. These packages tend to take up too much space on a printed circuit board. Therefore, efforts have been made to increase the packing density of integrated circuit chips on printed circuit boards such that a single board could perform more functions. Flip chip technology eliminates packages by simply bonding the integrated circuit chips directly to the printed circuit board. Solder balls are placed on the chip terminals and then chips are flipped over for connecting the solder balls to terminals on the printed circuit board. Eliminating the large package allows more chips to be mounted on a printed circuit board. Closer packing of integrated circuit chips reduces the signal delay between each chip.

However, flip chip technology requires precise placement of chips on the board and equipment that will delicately handle the integrated circuit chip when applying the solder ball and flipping the chip. It is also difficult to bond the flip chip to the terminals on the printed circuit board if the terminals are not the same height. Moreover, a tremendous amount of heat is developed by closely spaced integrated circuit chips during operation of the printed circuit board. Excess heat will interfere with operation of integrated circuit chips; therefore, a need exists for cooling each chip and isolating each chip from the heat effects of neighboring chips.

The most serious drawback of flip chip technology is the inability to permit easy chip replacement. Because the integrated circuit chips are soldered closely to the board it is difficult to remove a defective chip and, therefore, it is often necessary to dispose of the entire printed circuit board if circuit testing indicates chip defects or chip connection defects.

SUMMARY OF THE INVENTION

It is therefore an object of this invention to provide a method and apparatus for packaging integrated circuit chips such that the chips are electrically connected to interconnect leads on a printed circuit board by a touch contact or a rubbing contact formed between the interconnect leads and conductive leads connected to the chip terminals.

It is another object of this invention to provide a cooling cap for an integrated circuit chip which has the dual function of cooling the chip and forcing the conductive leads extending from the chip terminals into contact with the interconnect leads on the printed circuit board.

It is yet another object of this invention to provide a compliant backing for the conductive leads connected to the chip terminals to compensate for varying heights of interconnect leads on a printed circuit board.

It is still another object of this invention to provide a hermetic seal between the printed circuit board and the cooling cap.

According to the invention, an integrated circuit chip is attached directly into a circuit on a substrate board. The invention is an extension of the bare-chip socket concept of McMullen and Neugebauer described in Ser. No. 687,684, filed Dec. 31, 1984 and now abandoned. A set of thin copper leads is TAB mounted to the contact terminals on an integrated circuit chip. The leads may be patterned on a flexible lead carrier. Such patterned leads include multiple lead terminations configured in the reverse image of the contact terminals of the integrated circuit chips. A thin layer of room temperature vulcanizable (RTV) rubber is deposited around the periphery of the chip to provide a backing for the leads. The rubber backing supplies a compliant force which makes up for small variations in centering frame aperture dimensions and assures that all circuit board base are at different heights. In the touch contact configuration, the leads extend from the chip terminals to the peripheral edge of the chip and are cemented to a RTV rubber gasket disposed around the base edge of the chip. In the rubbing contact configuration, the leads extend from the chip terminals around the peripheral edge of the chip to the side of the chip and are cemented to a RTV rubber gasket disposed around the base edge and sides of the chip. The leads are cemented to the rubber gasket to hold them in place during handling.

A centering frame adapted to receive and align the integrated circuit chip is situated atop the printed circuit board. The centering frame is generally cylindrical and has an aperture in the center which exposes the interconnection leads on the printed circuit board to which the integrated circuit chip will be connected via the thin copper leads extending from the chip terminals. The top surface of the centering frame is sloped downward to the aperture. The chip is placed in the aperture of the centering frame with the aperture causing the alignment of the leads extending from the chip terminals with the interconnection leads on the printed circuit board. In the rubbing contact configuration, the interconnection leads on the printed circuit board are cemented to the side walls of the aperture in the centering frame. The conductive leads extending from the chip terminals extend around to the side of the chip. When the chip is placed in the centering frame the conductive leads will "rub" against the interconnection leads within the aperture of the centering frame.

A cooling cap having the daal function of supplying the force necessary to accomplish a pressure-fit electrical connection between the conductive leads extending from the chip terminals and the interconnect leads on the printed circuit board and of carrying away heat from the integrated circuit chip during its operation, is placed over the centering frame. The cooling cap is flexed downwardly in its center to provide a spring force against the top side of the integrated circuit chip. The flexed region of the cap coincides with the sloped top surface of the centering frame. The spring force causes the chip to be held in tight contact with the mounting board and causes the leads on the chip terminal to realize a pressure-fit electrical contact. The inside surface of the cooling cap's side wall frictionally engages the centering frame's side wall so that placement of the cooling cap is accomplished simply by sliding the cooling cap over the centering frame. The cooling cap is made of high thermal conductivity metal such as nickel (Ni) plated copper (Cu). Thermal transfer of heat from the integrated circuit chip to the cooling cap is permitted by the bottom side of the central flexed region of the cap pressing tightly against the top side of the integrated circuit chip. If space around the chip is at a premium, some other form of cap will be required to apply the force need for a pressure fit electrical contact. A finned cap structure can be provided if the chip generates an excess of heat.

A bead of cement can be provided about the base of the centering frame to allow the integrated circuit chip to be semi-hermetically sealed between the cooling cap and the printed circuit board within the centering frame. An inwardly flexed side wall provides the tight frictional fit between the inside surface of the cooling cap and the side wall of the centering frame. The bead of cement joins the flexed portion of the cooling cap to the side wall of the centering frame and to the printed circuit board. Mounting the chip to the interconnect on the printed circuit board is self packaging in that the package comprises the centering frame, the cooling cap, and the printed circuit board.

BRIEF DESCRIPTION OF THE DRAWINGS

The foregoing and other objects, aspects and advantages of the invention will be better understood from the following detailed description of the invention with reference to the drawings, in which:

FIG. 1 is a cross-sectional side view of an integrated circuit chip connected to a printed circuit board showing the touch configuration of the lead from the chip terminal to the interconnect lead on the printed circuit board;

FIG. 3 is a cross-sectional side view of a package created on a printed circuit board which allows the leads from the chip terminals to form a pressure fit electrical connection with the interconnect leads on the printed circuit board, as viewed along line 3—3 of FIG. 4;

FIG. 4 is a top view of a cooling cap placed on a printed circuit board showing the approximate position of the integrated circuit chip and centering frame underneath the cooling cap;

FIG. 5 is a cross-sectional side view of a hermetic seal disposed about the centering frame and formed between the cooling cap and the printed circuit board; and FIG. 6 is a cross-sectional side view of a chip which has been self packaged on a printed circuit board and showing a finned cooling structure integral with the cooling cap.

DETAILED DESCRIPTION OF THE PREFERRED EMBODIMENT OF THE INVENTION

Figure 2:
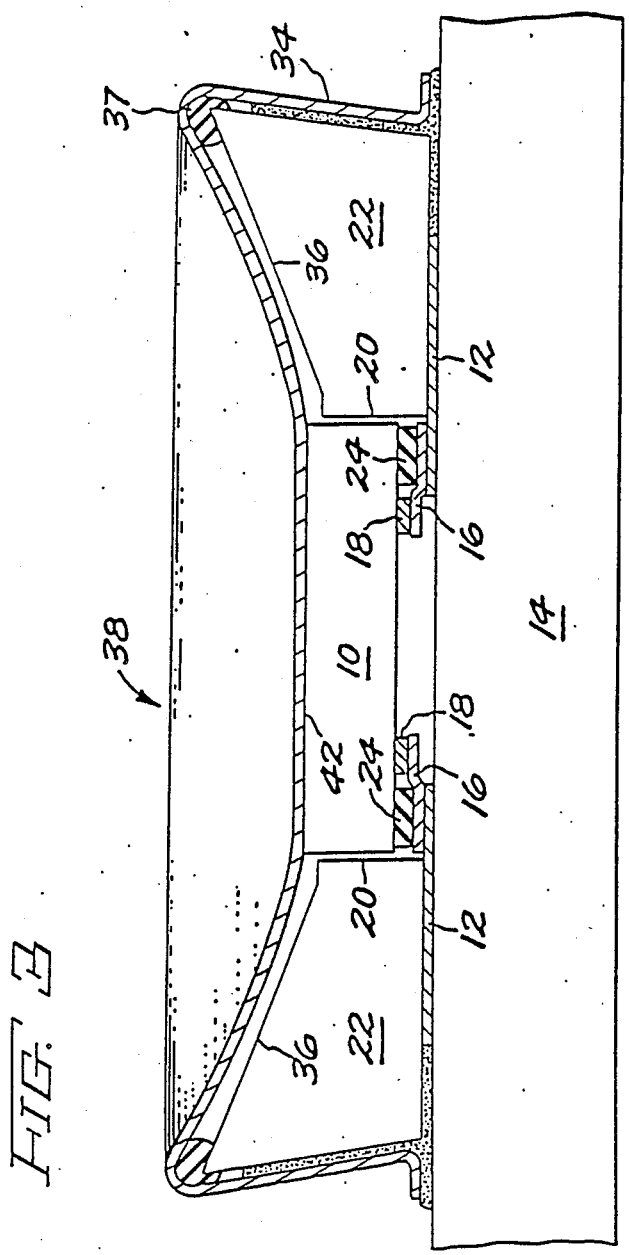
FIG. 2 is a cross-sectional side view of an integrated circuit chip connected to a printed circuit board showing the rubbing configuration of the lead from the chip terminal to the interconnect lead on the side wall of the aperture in the centering frame.

Referring now to the drawings and, more particularly, to FIG. 1, an integrated circuit chip 10 is electrically connected in a touching contact configuration to an interconnect lead 12 on a printed circuit board 14 by a thin copper lead 16 extending from a chip terminal 18. The copper lead 16 may be disposed on a flexible carrier tape (not shown) and the lead 16 can be joined to the chip terminal 18 by a TAB machine. The side wall 20 of an aperture in the centering frame 22 is used to align the copper lead 16 with the interconnect lead 12. A rubber gasket 24 made of RTV rubber having a rectangular cross section is disposed about the periphery of the bottom 26 of the integrated circuit chip 10. The copper lead 16 is cemented to the rubber gasket 24 to hold it in place during handling. The rubber gasket 24 provides a compliant force which assures that all connections are made reliably even if the interconnect leads 12 on the printed circuit board 14 are at different heights.

FIG. 2 shows an integrated circuit chip 10 electrically connected in a rubbing contact configuration with an interconnect lead 12 wherein the interconnect lead 12 is positioned on a printed circuit board 14 and cemented to the side wall 20 of an aperture in the centering frame 22. A copper lead 16 extending from the chip terminal 18 bends around the bottom 26 periphery to the side wall 28 of the integrated circuit chip 10. The copper lead 16 may be disposed on a flexible carrier tape (not shown) and the lead 16 can be joined to the chip terminal 18 by a TAB machine. The copper lead 16 is cemented to a rubber gasket 24 made of RTV rubber which is disposed on the bottom 26 periphery and side wall 28 of the integrated circuit chip 10 to hold it in place during handling. The rubber gasket 24 supplies a compliant force which makes up for small variations in the dimensions of the aperture in the centering frame 22 and assures that all connections are made reliably even if the interconnect leads 12 on the centering frame 22 are at different heights from the side wall 20 of the aperture. An advantage of rubbing contacts is that they may scratch through a thin oxide film 30 which may have formed on the metal surfaces. In addition, larger areas of metal may be in contact than in the touch contact configuration.

FIG. 3 shows an integrated circuit chip 10 self packaged on a printed circuit board where the package comprises a cooling cap 34, a centering frame 22, and the printed circuit board 14 The cooling cap includes vertically-extending corrugations (not shown) on the vertical circumferential surface thereof. The top surface 36 of the centering frame 22 is sloped downwardly to the aperture side walls 20 in the centering frame. An RTV rubber or other compliant gasket 37 around the circumference of surface 36 at its uppermost portion thereof contributes to semi-hermetic sealing between cooling cap 34 and centering frame 22. A flexed central region 38 in the cooling cap 34 coincides with the sloped top 36 surface of the centering frame 22. FIG. 4 shows that the aperture in the centering frame 22 has four side walls 20 in which the integrated circuit chip 10 is positioned. The centering frame 22 serves to properly align the integrated circuit chip on the printed circuit board. The cooling cap 34 is placed over the integrated circuit chip 10 and centering frame 22 to form a package 32 on the printed circuit board 14, and held in place by a cement compound 40. The illustration of FIG. 3 is taken along line 3—3 of FIG. 4.

Returning to FIG. 3, the flexed central region 38 in the cooling cap 34 forces the integrated circuit chip 10 down inside the aperture of the centering frame 22 and tightly against the mounting board 14. The spring force created by the flexed central region 38 causes pressure-fit electrical connections to be formed between the copper leads 16 and the interconnect leads 12 positioned on the printed circuit board 14. FIG. 3 specifically shows a touch contact configuration, however, a rubbing contact configuration would be accommodated by the same centering frame 22 and cooling cap 34 arrangement.

FIG. 5 shows the outside edge of the cooling cap 34 joined to the centering frame 22 and the printed circuit board 14 by cement compound 40. The illustrated portion of the sidewall of cooling cap 34 comprises an inwardly flexed, vertically corrugated region which frictionally engages the centering frame 22. For simplicity of illustration, the corrugations are not shown in FIG. 5. When being installed, the cooling cap 34 is forced to slide down the side wall 43 of the centering frame 22. A continuous bead of cement 40 at the base of the centering frame 22 forms a semi-hermetic seal separating the integrated circuit chip inside the package from the outside environment when the cooling cap 34 is pushed down on the centering frame 22. However, the cement 40 seal is not necessary for causing the pressure-fit electrical connection between the copper leads extending from the chip terminals and the interconnect leads on the printed circuit board.

The cooling cap is made of a high thermal conducting metal such as Ni plated Cu. FIG. 3 shows the central flexed region 38 of the cooling cap 34 in a side-by-side heat transfer relationship with the top 42 of the integrated circuit chip. The thermally conducting metal comprising the cooling cap 34 effectively carries heat produced by chip 10 to the larger area of cooling cap 34. If the integrated circuit chip produces an excess quantity of heat, finned structures can be employed on the cooling cap. FIG. 6 shows a finned cooling tower 44 integral with the cooling cap 34. The fins 46 create a large surface area to dissipate heat carried away from the integrated circuit chip 10.

Connecting the integrated circuit chip to the mounting board is a self packaging operation. First, conductive leads are TAB bonded to the chip terminals. Second, the conductive leads are cemented to a rubber gasket disposed about the periphery of the integrated circuit chip. Third, the integrated circuit and conductive lead arrangement is placed in an aperture of a centering frame where the centering frame is secured to a printed circuit board. Interconnect leads on the printed circuit board extend from under the centering frame into the aperture. The conductive leads extending from the chip terminals either touch or rub against the interconnect leads in the aperture, depending on the package configuration. Fourth, a cooling cap is placed over the integrated circuit chip and centering frame where the cooling cap has the dual purpose of supplying the force to accomplish a pressure-fit electrical connection between the conductive leads extending from the chip terminals and the interconnect leads on the printed circuit board and of carrying away heat produced by the integrated circuit chip. Optionally, a cement seal can be formed around the base of the centering frame to provide a semi-hermetic seal for the integrated circuit chip. An improved semi-hermetic seal is achieved by providing a rubber gasket around the upper periphery of the centering frame. The package as shown in FIGS. 3 and 4 is circular; however, if space is at a premium on the mounting board, other geometric configurations, such as squares and rectangles, could be used by simply changing the geometry of the centering frame and the cooling cap. Integrated circuit chips which are "bad" can be easily replaced by simply removing the cooling cap and inserting a new integrated circuit chip into the centering frame.

While the invention has been described in terms of the preferred embodiment, those skilled in the art will recognize that the components of the package may be varied within the spirit and scope of the appended claims.

What is claimed is:

1. A method of self packaging an integrated circuit chip on a printed circuit board wherein conductive leads extending from terminals on said chip form a pressure-fit electrical connection with interconnect leads positioned on said printed circuit board, comprising the steps of:

securing conductive leads to an integrated circuit chip;

cementing said conductive leads to a compliant backing member disposed about a periphery of said integrated circuit chip;

aligning said conductive leads with corresponding interconnect leads on a printed circuit board; and applying a cap over said integrated circuit chip onto said printed circuit board, said cap forcing said conductive leads and said interconnect leads to form pressure-fit electrical connections.

2. A method of self packaging an integrated circuit chip as recited in claim 1 wherein said step of aligning comprises the steps of:

providing a centering frame positioned on said printed circuit board, said centering frame having an aperture partially exposing said interconnect leads on said printed circuit board, said aperture having side walls; and placing said integrated circuit chip in said aperture, said side walls of said aperture in said centering frame serving to align said conductive leads with said interconnect leads.

3. A method of self packaging an integrated circuit chip on a printed circuit board wherein conductive leads extending from terminals on said chip make rubbing contact with interconnect leads extending from said printed circuit board, comprising the steps of:

securing conductive leads to an integrated circuit chip;

cementing said conductive leads to a compliant backing member disposed about a periphery of said integrated circuit chip;

aligning said conductive leads with corresponding interconnect leads extending from a printed circuit board; and applying a cap over said integrated circuit chip onto said printed circuit board, said cap retaining said integrated circuit in position atop said printed circuit board.

4. A method of self packaging an integrated circuit chip as recited in claim 3 wherein said step of aligning comprises the steps of:

providing a centering frame positioned on said printed circuit board, said centering frame having an aperture exposing said interconnect leads extending from said printed circuit board, said aperture having side walls supporting said interconnect leads; and placing said integrated circuit chip in said aperture, said side walls of said aperture in said centering frame serving to align said conductive leads with said interconnect leads.

* * * * *